United States Patent
Hiraoka

(10) Patent No.: US 10,367,482 B2
(45) Date of Patent: Jul. 30, 2019

(54) SCHMITT TRIGGER CIRCUIT

(71) Applicants: KABUSHIKI KAISHA TOSHIBA, Minato-ku, Tokyo (JP); TOSHIBA ELECTRONIC DEVICES & STORAGE CORPORATION, Minato-ku, Tokyo (JP)

(72) Inventor: Takayuki Hiraoka, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 15/917,020

(22) Filed: Mar. 9, 2018

(65) Prior Publication Data

US 2019/0074822 A1  Mar. 7, 2019

(30) Foreign Application Priority Data

Sep. 5, 2017  (JP) ................................. 2017-170249

(51) Int. Cl.
| H03K 3/00 | (2006.01) |
| H03K 3/3565 | (2006.01) |
| H03K 3/356 | (2006.01) |
| H03K 17/30 | (2006.01) |

(52) U.S. Cl.
CPC ..... *H03K 3/3565* (2013.01); *H03K 3/356086* (2013.01); *H03K 17/302* (2013.01)

(58) Field of Classification Search
CPC .. H03K 3/2893; H03K 3/3565; H03K 3/0377; H03K 3/356086; H03K 3/02337; H03K 17/302
See application file for complete search history.

(56) References Cited

U.S. PATENT DOCUMENTS

| 6,198,334 B1 * | 3/2001 | Tomobe | H03K 5/1252 |
| | | | 327/112 |
| 2003/0076144 A1 | 4/2003 | Hirose | |
| 2017/0070213 A1 * | 3/2017 | Zhao | H03K 3/3565 |

FOREIGN PATENT DOCUMENTS

| JP | 06343025 A * | 12/1994 |
| JP | 10163826 A | 6/1998 |
| JP | 2003133918 A | 5/2003 |
| JP | 3636848 B2 | 4/2005 |

\* cited by examiner

*Primary Examiner* — Long Nguyen
(74) *Attorney, Agent, or Firm* — Holtz, Holtz & Volek PC

(57) ABSTRACT

A Schmitt trigger circuit includes a first circuit; a second circuit; a first switch; a third circuit; and a second switch. The first circuit output the output signal of a second or first logical level. The second circuit is coupled to a first potential node at a first end, and sends a current between the first end and a second end based on the output signal. The first switch electrically couples or uncouples the second end and a first node based on a selection signal. The third circuit is coupled to a second potential node at a third end, and sends a current exclusively with the second circuit between the third end and a fourth end based on the output signal. The second switch electrically couples or uncouples the fourth end and the first node based on the selection signal.

8 Claims, 11 Drawing Sheets

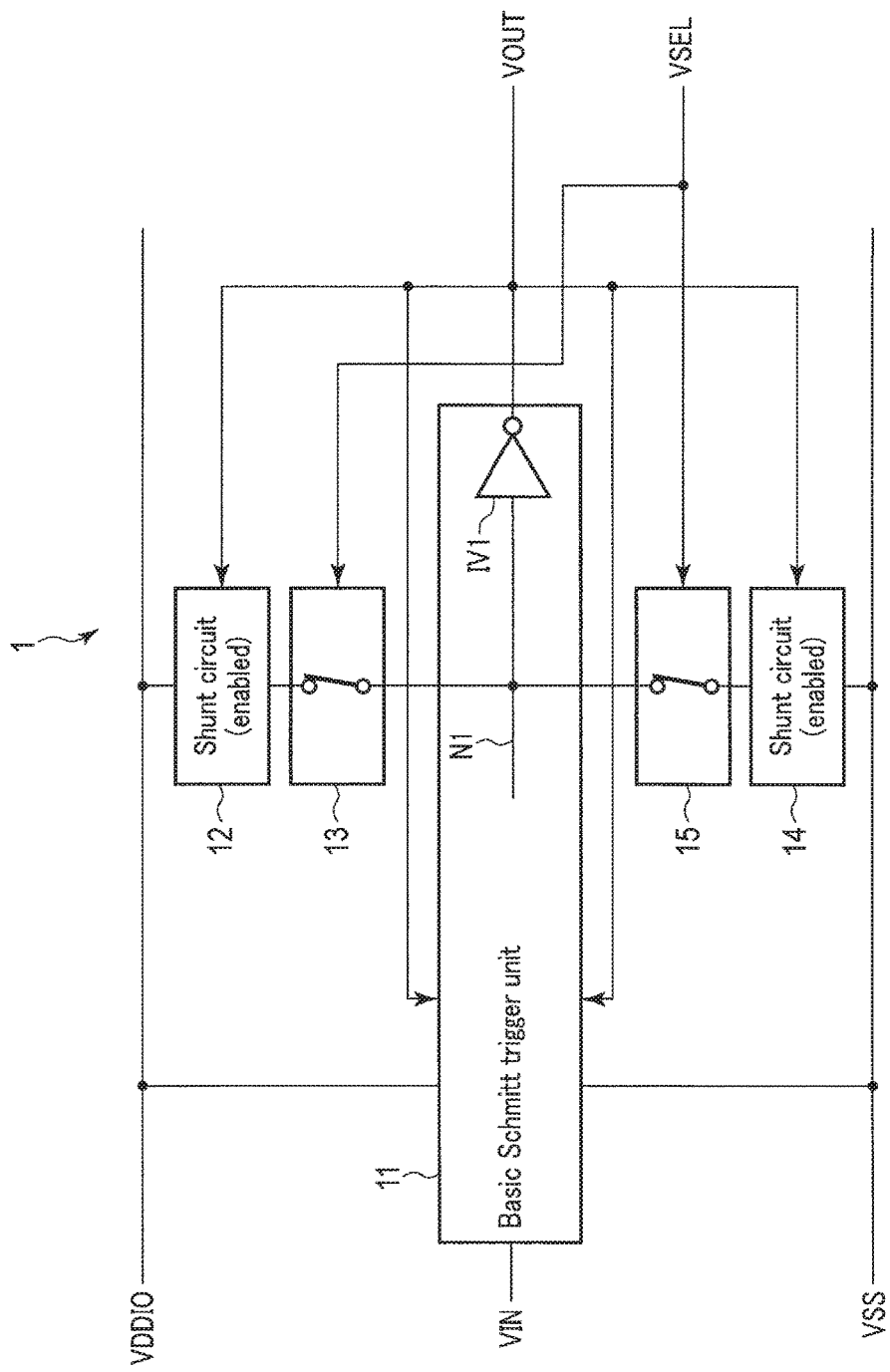
F I G. 5

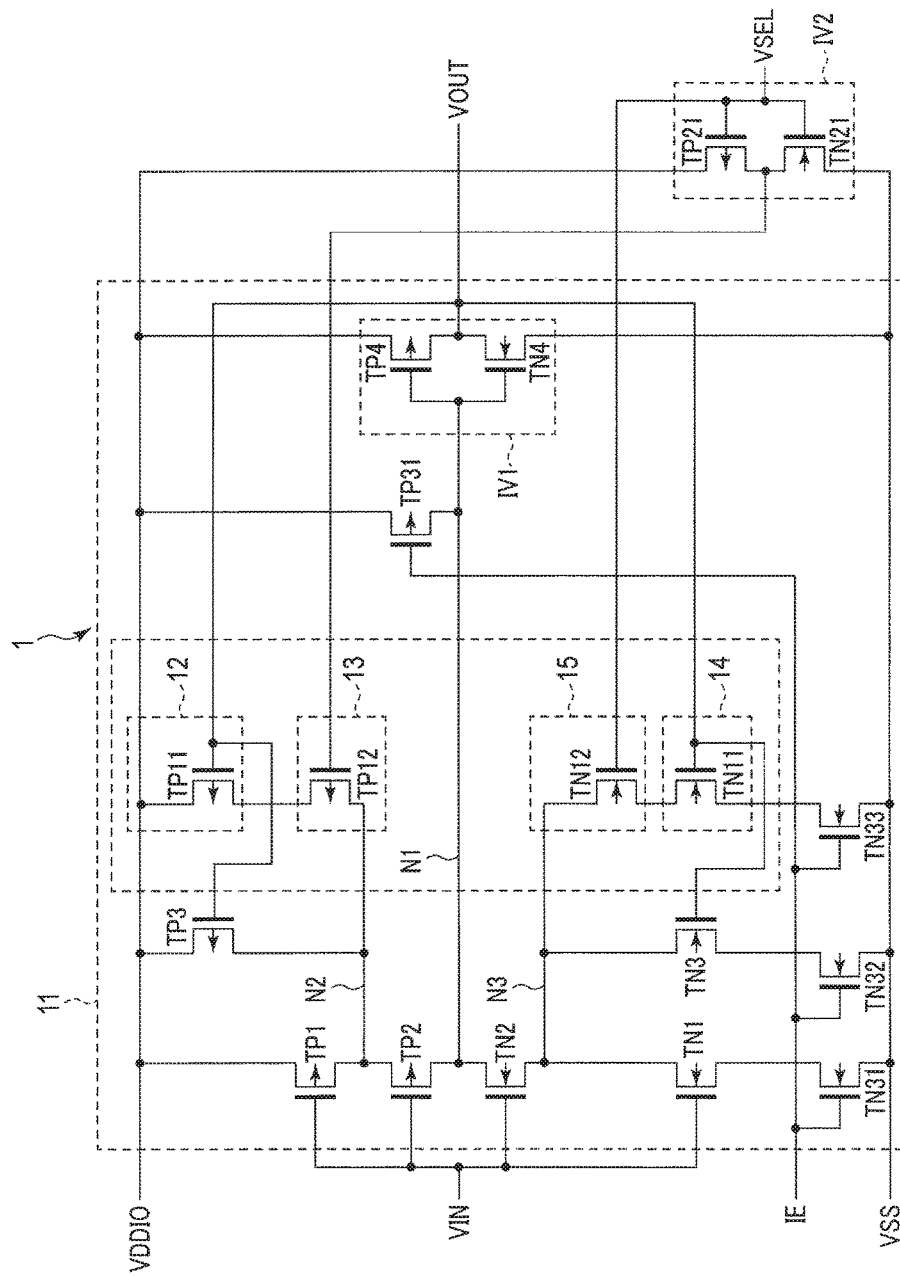
F I G. 10

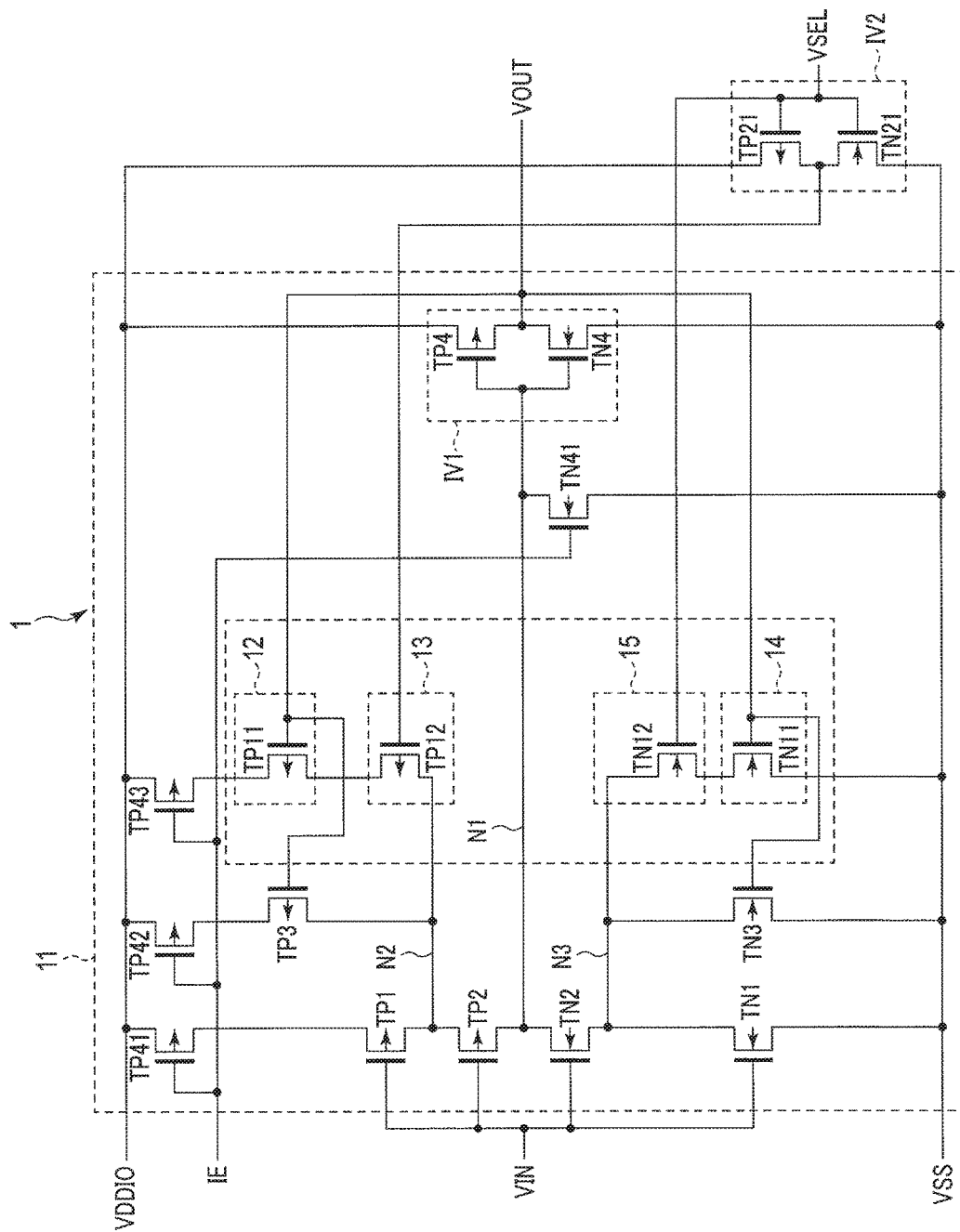
F I G. 11

US 10,367,482 B2

SCHMITT TRIGGER CIRCUIT

CROSS-REFERENCE TO RELATED APPLICATIONS

This application is based upon and claims the benefit of priority from Japanese Patent Application No. 2017-170249, filed Sep. 5, 2017, the entire contents of which are incorporated herein by reference.

FIELD

Embodiments described herein relate generally to a Schmitt trigger circuit.

BACKGROUND

In general, according to one embodiment, a digital input signal is determined to be high when it has a voltage higher than a particular threshold, and determined low when it has a voltage below that threshold. For example, when a voltage of an input signal determined to be low rises and becomes above a threshold, it is determined that the input signal changed to be high. Similarly, when the voltage of the input signal determined to be high lowers and becomes below that threshold, it is determined that the input signal changed to be low.

In a circuit handling such digital signals, a Schmitt trigger circuit may be used. The Schmitt trigger circuit also receives a digital input signal, and outputs a digital signal according to the logical level of the input signal. In the Schmitt trigger circuit, a threshold above which the voltage of the input signal currently determined as low rises to be determined as having changed to be high differs from a threshold below which the voltage of the input signal currently determined as high lowers to be determined as having changed to be low.

BRIEF DESCRIPTION OF THE DRAWINGS

FIG. 5 illustrates another state of the Schmitt trigger circuit of the first embodiment;

FIG. 10 illustrates a specific example of the Schmitt trigger circuit of the second embodiment; and FIG. 11 illustrates a specific example of a Schmitt trigger circuit of a third embodiment.

DETAILED DESCRIPTION

Figure 1:
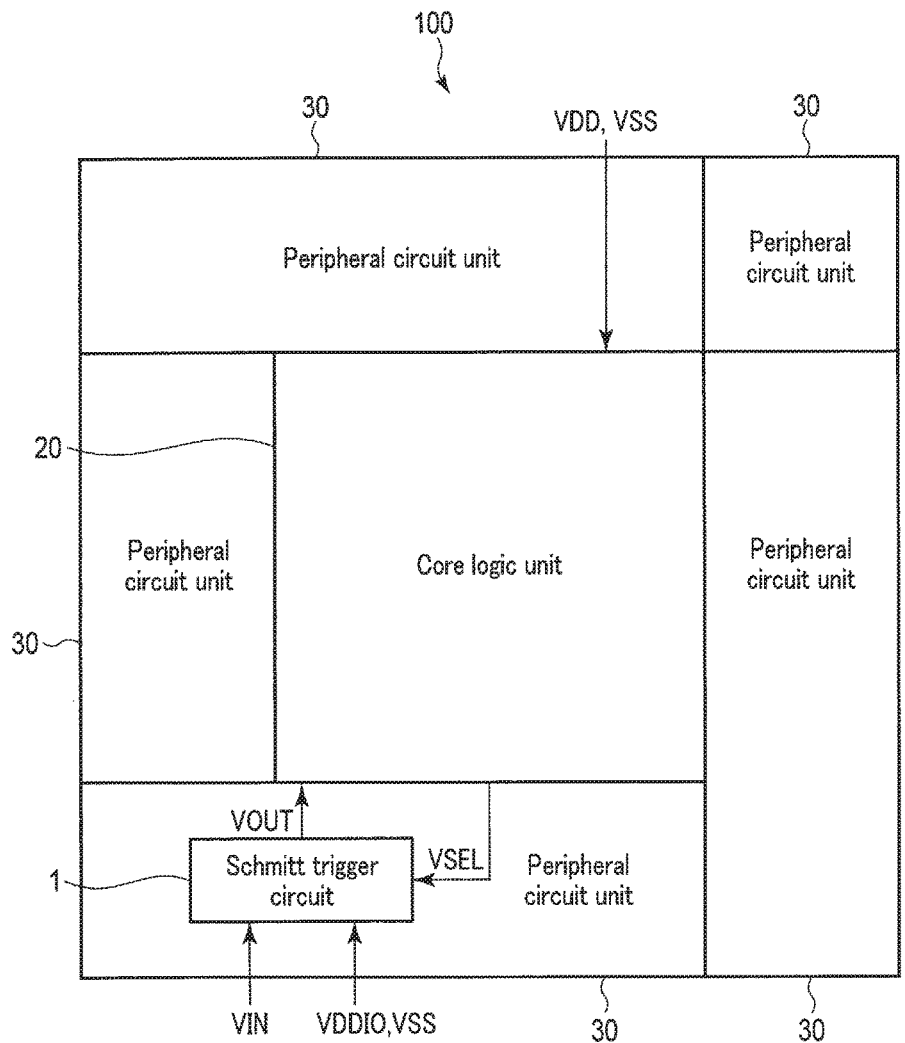
FIG. 1 illustrates a Schmitt trigger circuit of a first embodiment and an example of the layout of a semiconductor device including the same.

In general, a Schmitt trigger circuit includes a first circuit; a second circuit; a first switch; a third circuit; and a second switch. The first circuit includes a first node, and is configured to output an output signal based on a potential of the first node, output the output signal of a second logical level when the first circuit receives an input signal higher than or equal to a first threshold while outputting the output signal of a first logical level, and output the output signal of the first logical level when the first circuit receives the input signal lower than a second threshold while outputting the output signal of the second logical level. The second threshold is lower than the first threshold. The second circuit includes a first end and a second end, is coupled to a first potential node at the first end, and is configured to send a current between the first end and the second end based on a logical level of the output signal. The first switch electrically couples or uncouples the second end of the second circuit and the first node based on a selection signal. The third circuit includes a third end and fourth end, is coupled to a second potential node at the third end, and is configured to send a current exclusively with the second circuit between the third end and the fourth end based on a logical level of the output signal. The second potential node has potential lower than a potential of the first potential node. The second switch electrically couples or uncouples the fourth end of the third circuit and the first node based on the selection signal.

Embodiments will now be described with reference to the figures. In the following description, components with substantially the same functionalities and configurations will be referred to with the same reference numerals, and repeated descriptions may be omitted. The figures are schematic, and the entire description for a particular embodiment also applies to another embodiment unless it is explicitly mentioned otherwise or obviously eliminated.

In the specification and the claims, a phrase of a particular first component being "coupled" to another second component includes the first component being coupled to the second component either directly or via one or more components which are always or selectively conductive.

First Embodiment

FIG. 1 schematically illustrates a Schmitt trigger circuit 1 of the first embodiment and an example of the layout of a semiconductor device 100 including the Schmitt trigger circuit 1. FIG. 1 illustrates a view of the semiconductor device 100 of the first embodiment when seen from above, i.e., a view along the xy-plane over which the semiconductor device 100 spreads. The semiconductor device 100 is configured as one chip, for example.

As illustrated in FIG. 1, the semiconductor device 100 includes a core logic unit 20 and plural peripheral circuit units 30. The core logic unit 20 is located, for example in the center in the xy-plane of the semiconductor device 100, and the peripheral circuit units 30 are located around the core logic unit 20.

The core logic unit 20 includes various active elements, such as transistors and capacitors, and passive elements, such as resistors and interconnects, performs various forms of signal processing, transmits signals to the peripheral circuit units 30, and receives signals from the peripheral circuit units 30.

The peripheral circuit units 30 includes plural pads (not shown), for example. The pads receive signals and power supply potentials input into the semiconductor device 100, and output signals from the semiconductor device 100. The power supply potentials include a power supply potential VDD, a ground potential VSS, and a power supply potential for peripheral circuits VDDIO. The power supply potential VDD and the ground potential VSS are supplied, for example to the core logic unit 20.

At least one of the peripheral circuit units 30 includes the Schmitt trigger circuit 1. The Schmitt trigger circuit 1 receives an input signal VIN from a pad in the peripheral circuit unit 30 in which the Schmitt trigger circuit 1 is provided. The Schmitt trigger circuit 1 receives the power supply potential VDDIO and the ground potential VSS, operates using the power supply potential VDDIO, and supplies an output signal VOUT based on the input signal VIN to the core logic unit 20. The power supply potential VDDIO is either of at least two potentials of different magnitudes, and is higher than the ground potential VSS. The Schmitt trigger circuit 1 can operate with either of the power supply potentials VDDIO of two different magnitudes.

The Schmitt trigger circuit 1 serves as an input buffer for the semiconductor device 100. The Schmitt trigger circuit 1 receives a digital selection signal VSEL from the core logic unit 30, and operates in a mode based on the selection signal VSEL. Specifically, the Schmitt trigger circuit 1 operates in a first mode while receiving a selection signal VSEL of a first logical level, and it operates in a second mode while receiving a selection signal VSEL of a second logical level.

The selection signal VSEL is generated by the core logic unit 20 based on a voltage selection signal from outside the semiconductor device 100. The voltage selection signal is generated in a circuit different from the semiconductor device 100 based on the user of the semiconductor device 100. The voltage of high-level of the selection signal VSEL is based on the power supply potential VDDIO. For example, the selection signal VSEL is generated by generating a signal with the power supply potential VDD when high in the core logic unit 20, and converting the generated signal into a signal with the power supply potential VDDIO of high by a level shift circuit (not shown).

The selection signal VSEL is associated with the magnitude of the power supply potential VDDIO. Specifically, the selection signal VSEL has a first logical level while a power supply potential VDDIO of a particular first magnitude is being supplied to the semiconductor device 100, and it has a second logical level while a power supply potential VDDIO of a second magnitude is being supplied to the semiconductor device 100.

Figure 2:
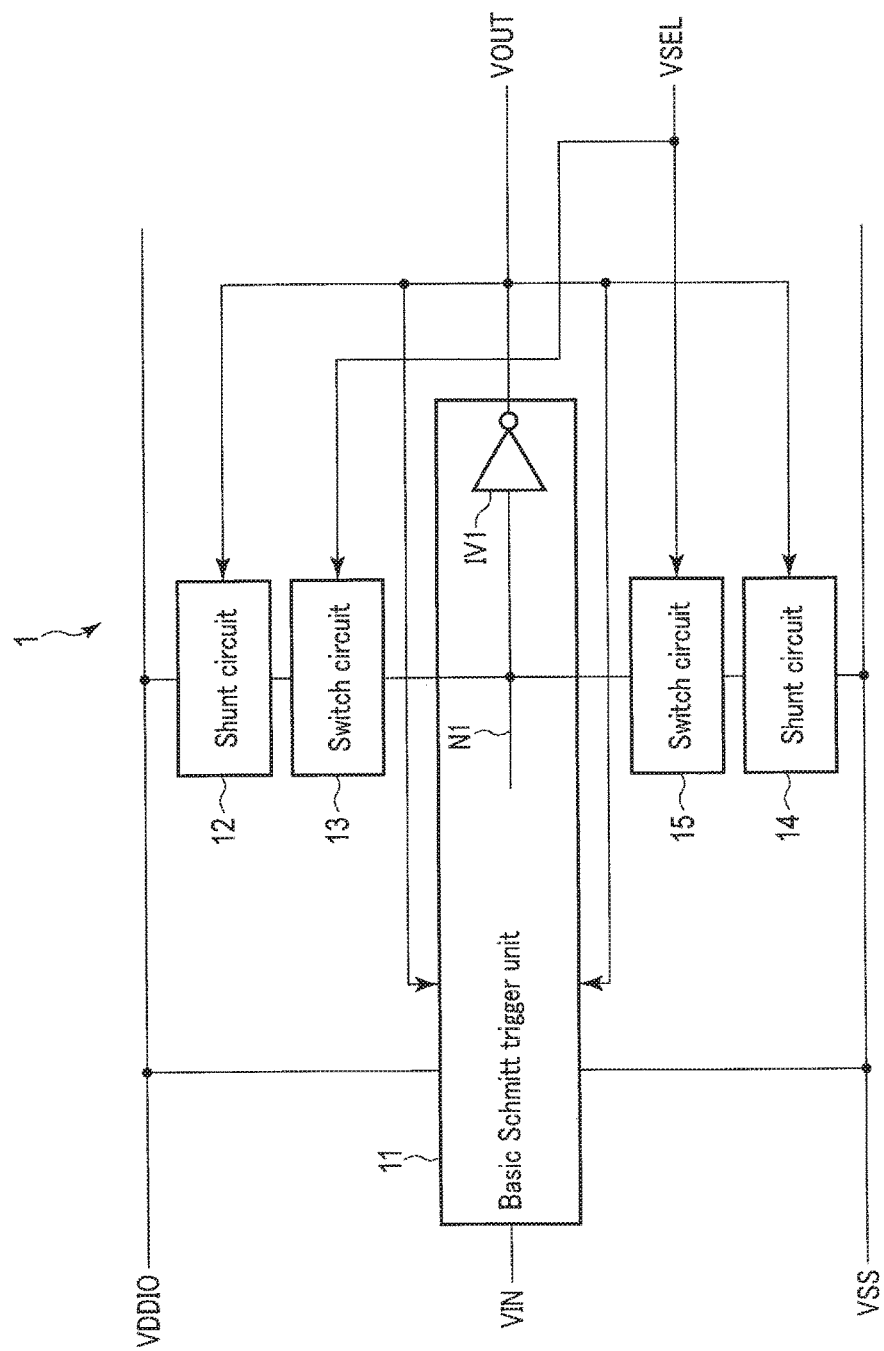
FIG. 2 is a circuit diagram of the Schmitt trigger circuit of the first embodiment.

FIG. 2 is a circuit diagram of the Schmitt trigger circuit 1 of the first embodiment. As illustrated in FIG. 2, the Schmitt trigger circuit 1 includes a basic Schmitt trigger unit (circuit) 11, a shunt circuit 12, a switch circuit 13, a shunt circuit 14, a switch circuit 15, and an inverter circuit IV1.

The basic Schmitt trigger unit 11 is coupled between a node to which the potential VDDIO is supplied (to be referred to as a node VDDIO), and a node to which the potential VSS is supplied (to be referred to as a node VSS).

Figure 3:
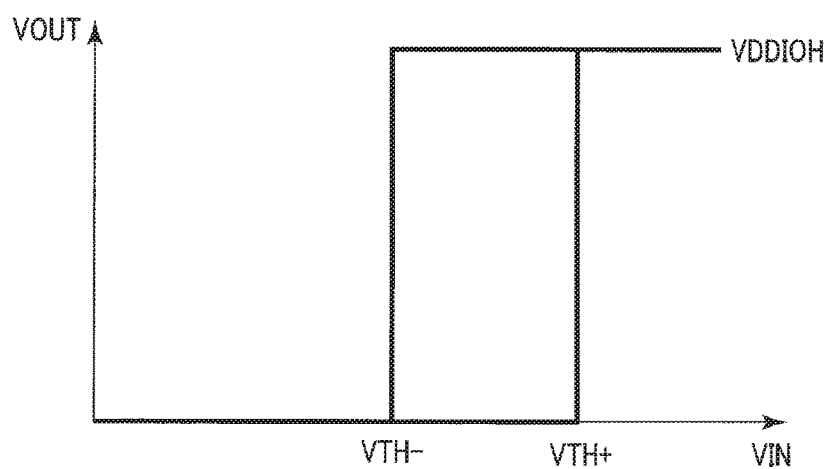
FIG. 3 illustrates the relationship between an input voltage and an output voltage of a basic Schmitt trigger unit of the first embodiment.

The basic Schmitt trigger unit 11 can be any type of known Schmitt trigger circuit as long as it has a hysteresis characteristic as illustrated in FIG. 3. Specifically, the basic Schmitt trigger unit 11 keeps outputting an output signal VOUT of the low level of the voltage VSS while receiving an input signal VIN of a voltage lower than a threshold VTH−, as illustrated in FIG. 3. Moreover, the basic Schmitt trigger unit 11 starts outputting the output signal VOUT of the high level of a voltage VDDIOH when the voltage of the input signal VIN rises to be higher than a threshold VTH+ while the basic Schmitt trigger unit 11 is outputting the output signal VOUT of the low level. The voltage VDDIOH is one of plural power voltages VDDIO. Moreover, the basic Schmitt trigger unit 11 starts outputting the signal of the low level of the voltage VSS when the voltage of the input signal VIN falls to be lower than a threshold VTH− while the basic Schmitt trigger unit 11 is outputting the output signal VOUT of the high level. In other words, the basic Schmitt trigger unit 11 has the thresholds VTH+ and VTH−. When the input signal VIN currently determined as the low level becomes higher than the threshold VTH+, the input signal VIN is determined to have become high. When the input signal VIN currently determined as the high level becomes lower than the threshold VTH−, the input signal VIN is determined to have become low. The thresholds VTH− and VTH+ are set up, or optimized, in accordance with the Schmitt trigger circuit 1 operating in one of the multiple power supply potentials VDDIO of different respective magnitudes.

As an example for enabling such an operation, the basic Schmitt trigger unit 11 can have the following structure. The basic Schmitt trigger unit 11 includes a node N1, an inverter circuit IV1, and two shunt circuits (not shown). The input of the inverter circuit IV1 is coupled to the node N1, and the output of the inverter circuit IV1 outputs the output signal VOUT. One of the shunt circuits is provided between the node VDDIO and the node N1, and the other of the shunt circuits is provided between the node N1 and the node VSS. One of the two shunt circuits is enabled and forms a current path between the node VDDIO and the node N1 while receiving an output signal VOUT of a first logical level. The other of the two shunt circuits is enabled and forms a current path between the node N1 and the node VSS while receiving an output signal VOUT of a second logical level. Thus, only one of the two shunt circuits is enabled exclusively.

Referring back to FIG. 2, the shunt circuit 12 and the switch circuit 13 are coupled in series in this order between the node VDDIO and the node N1. The shunt circuit 12 is activated or inactivated based on the logical level of the output signal VOUT, is activated while receiving an output signal VOUT of a first logical level, and is activated while receiving the output signal VOUT of a second logical level. The shunt circuit 12 forms a current path between the node VDDIO and the switch circuit 13 while activated.

The switch circuit 13 is turned on or off by the control from outside the switch circuit 13, is turned on or off, for example, based on the logical level of the selection signal VSEL, and remains off while the selection signal VSEL has a first logical level and remains on while the selection signal VSEL has a second logical level. The switch circuit 13 controls electrical coupling of the shunt circuit 12 to the node VDDIO and the node N1, and electrically couples the shunt circuit 12 to the node VDDIO and the node N1 while it remains on. In other words, the turned-on switch circuit 13 allows the shunt circuit 12 to form or not form a current path between the node VDDIO and the node N1 based on the activation or inactivation of the shunt circuit 12. Such a state is hereinafter referred to as that the shunt circuit 12 is enabled. Therefore, the shunt circuit 12 can form a current path between the node VDDIO and the node N1 in conjunction with the switch circuit 13 while enabled. In contrast, the shunt circuit 12 is disabled and cannot serve as a current path regardless of the logical level of the output signal VOUT while the switch circuit 13 remains off.

The switch circuit 15 and the shunt circuit 14 are coupled in series in this order between the node N1 and the node VSS. The shunt circuit 14 is activated or inactivated based on the logical level of the output signal VOUT, is activated while receiving the output signal VOUT of the second logical level, and is inactivated while receiving the output signal VOUT of the first logical level. Therefore, only one of the shunt circuits 12 and 14 is activated exclusively. The shunt circuit 14 forms a current path between the switch circuit 15 and the node VSS while activated.

The switch circuit 15 is turned on or off by the control from outside the switch circuit 15, is turned on or off, for example, based on the logical level of the selection signal VSEL and remains off while the selection signal VSEL has the first logical level and remains on while the selection signal VSEL has the second logical level. Therefore, both the switch circuits 13 and 15 are turned on, or both the switch circuits 13 and 15 are turned off. The switch circuit 15 controls electrical coupling of the shunt circuit 14 to the node N1 and the node VSS, and it electrically couples the shunt circuit 14 to the node N1 and the node VSS while it remains on. In other words, the turned-on switch circuit 15 allows the shunt circuit 14 to form or not form a current path between the node N1 and the node VSS based on the activation or inactivation of the shunt circuit 15. Such a state is hereinafter referred to as that the shunt circuit 14 is enabled. Therefore, the shunt circuit 14 can form a current path between the node N1 and the node VSS in conjunction with the switch circuit 15 while enabled. In contrast, the shunt circuit 14 is disabled and cannot serve as a current path regardless of the logical level of the output signal VOUT while the switch circuit 15 remains off.

Figure 4:
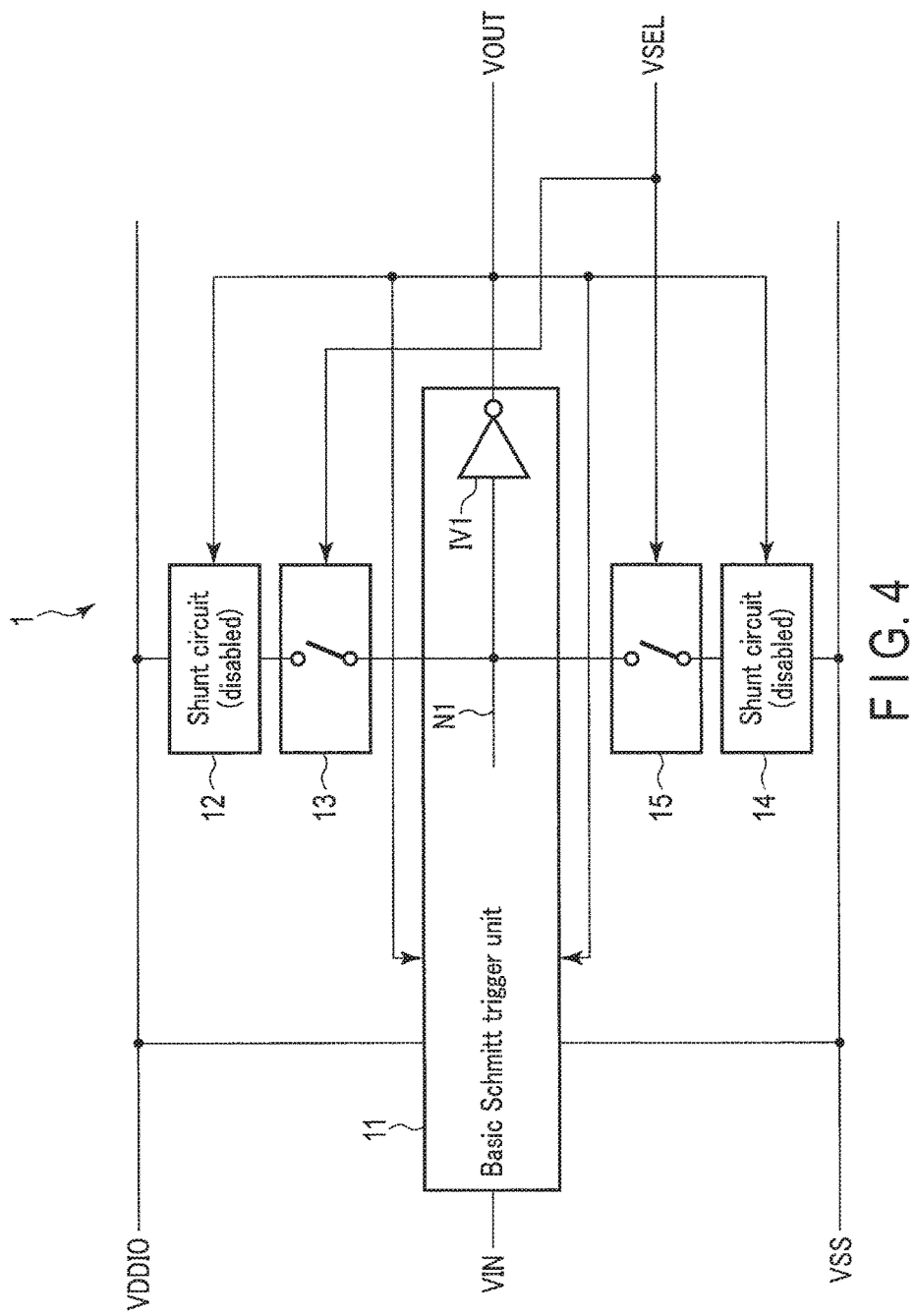
FIG. 4 illustrates one state of the Schmitt trigger circuit of the first embodiment.

The shunt circuits 12 and 14 operate as follows. While the signal VSEL has the first logical level, the switch circuits 13 and 15 remain off, and the shunt circuits 12 and 14 are disabled, as illustrated in FIG. 4.

In contrast, while the signal VSEL has the second logical level, the switch circuits 13 and 15 remain on, and the shunt circuits 12 and 14 are enabled, as illustrated in FIG. 5.

Therefore, based on the output signal VOUT, one of the shunt circuits 12 and 14 is activated exclusively, and the activated shunt circuit 12 or 14 forms a current path. For this reason, the Schmitt trigger circuit 1 has different states respectively with the activated shunt circuit 12 and activated shunt circuit 14, and such a difference in states causes the asymmetry of the thresholds of the Schmitt trigger circuit 1. Such asymmetry in turn gives a hysteresis characteristic to the Schmitt trigger circuit 1.

Hereinafter, a mode in which the selection signal VSEL has the first logical level and the shunt circuits 12 and 14 are disabled is referred to as a high-voltage mode, and a mode in which the selection signal VSEL has the second logical level and the shunt circuits 12 and 14 are enabled is referred to as a low-voltage mode. The node VDDIO has a potential VDDIOH in the high-voltage mode, and the node VDDIO has a potential VDDIOL in the low-voltage mode. The potential VDDIOL is one of the multiple power voltages VDDIO, and is lower than the potential VDDIOH.

Figure 6:
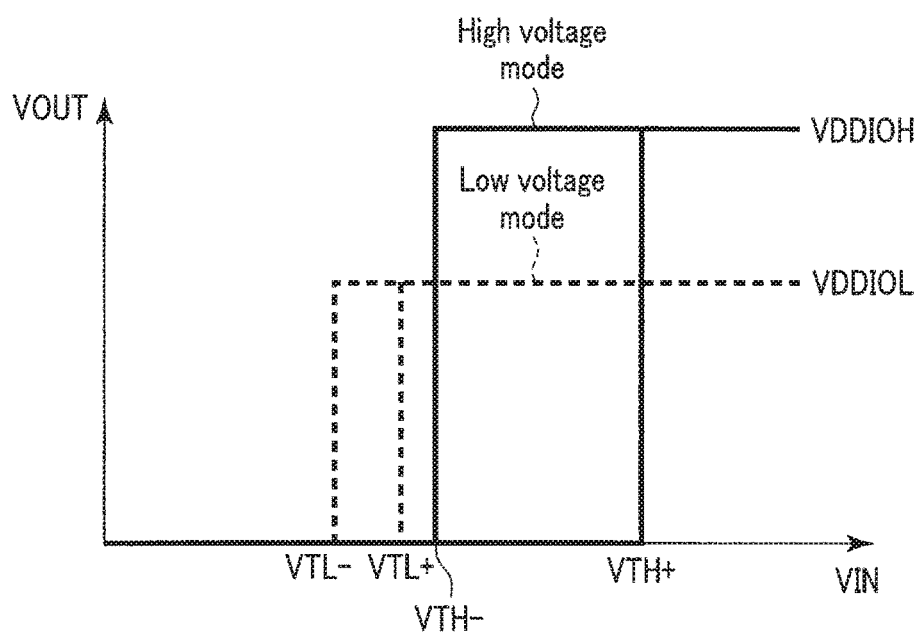
FIG. 6 illustrates the relationship between an input voltage and an output voltage of the Schmitt trigger circuit of the first embodiment.

Referring to FIG. 6, the operation of the whole Schmitt trigger circuit 1 will now be described. FIG. 6 illustrates the relationship between the input voltage and the output voltage of the Schmitt trigger circuit 1 of the first embodiment. FIG. 6 also illustrates the relationship between the input voltage and the output voltage for each of the low-voltage mode and the high-voltage mode. In the high-voltage mode, the shunt circuits 12 and 14 are disabled, and the Schmitt trigger circuit 1 exhibits the characteristic which the basic Schmitt trigger unit 11 has, as described above. Specifically, in the high-voltage mode, the Schmitt trigger circuit 1 keeps outputting the output signal VOUT of the low level of the voltage VSS while it is receiving the input signal VIN of the voltage lower than the threshold VTH−. The Schmitt trigger circuit 1 starts outputting the output signal VOUT of the high level of the voltage VDDIOH when the voltage of the input signal VIN rises to be equal to or higher than the threshold VTH+ while the Schmitt trigger circuit 1 is outputting the output signal VOUT of the low level. The Schmitt trigger circuit 1 starts outputting the output signal VOUT of the low level of the voltage VSS when the voltage of the input signal VIN falls to be equal to or lower than the threshold VTH− while the Schmitt trigger circuit 1 is outputting the output signal VOUT of the high level.

In contrast, in the low-voltage mode, the shunt circuits 12 and 14 are enabled. For this reason, the number of current paths between the node VDDIO and the node N1 is larger than that in the high-voltage mode, and the number of current paths between the node N1 and the node VSS is larger than that in the high-voltage mode. The Schmitt trigger circuit 1 outputting the output signal VOUT of the low level keeps outputting the output signal VOUT of the low level of the voltage VSS while it is receiving the input signal VIN of a voltage that is lower than a threshold VTL− (<threshold VTH−). The Schmitt trigger circuit 1 starts outputting the output signal VOUT of the high level of the voltage VDDIOL when the voltage of the input signal VIN rises to be equal to or higher than a threshold VTL+ (<threshold VTH+) while the Schmitt trigger circuit 1 is outputting the output signal VOUT of the low level. The Schmitt trigger circuit 1 starts outputting the output signal VOUT of the low level of the voltage VSS when the voltage of the input signal VIN falls to be equal to or lower than the threshold VTL− while the Schmitt trigger circuit 1 is outputting the output signal VOUT of the high level.

As described above, the characteristic of the basic Schmitt trigger unit 11 is that of the Schmitt trigger circuit 1 while the shunt circuits 12 and 14 are disabled. In other words, the shunt circuits 12 and 14 do not influence the characteristic of the Schmitt trigger circuit 1 while the basic Schmitt trigger unit 11 is solely in operation.

Figure 7:
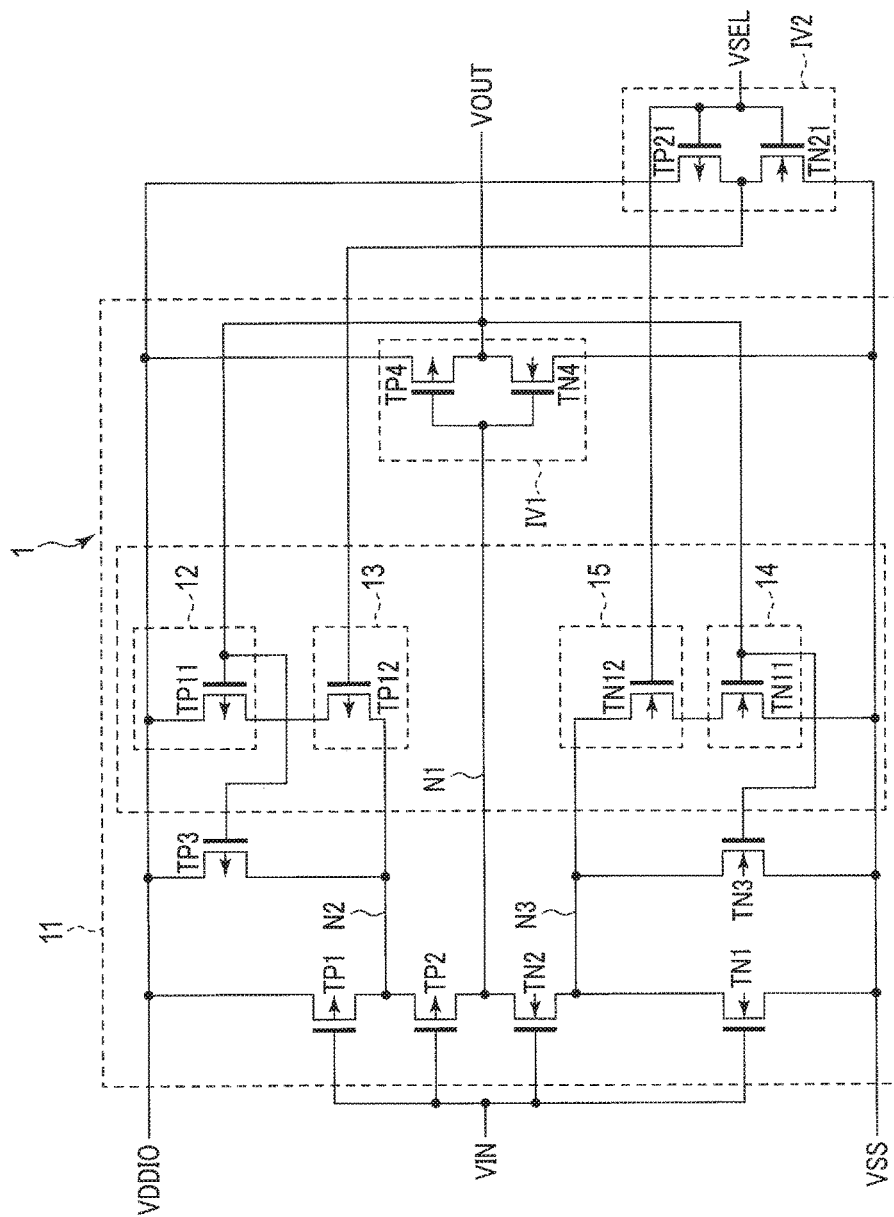
FIG. 7 illustrates a specific example of the Schmitt trigger circuit of the first embodiment.

Referring to FIG. 7, a specific example of the Schmitt trigger circuit 1 will now be described. As illustrated in FIG. 7, the basic Schmitt trigger unit 11 includes p-type metal oxide semiconductor field effect transistors (MOSFET) TP1, TP2, TP3, TP4 and n-type MOSFETs TN1, TN2, TN3, and TN4.

The transistors TP1, TP2, TN2, and TN1 are coupled in series in this order between the node VDDIO and the node VSS, and make an inverter circuit. The transistors TP1, TP2, TN1, and TN2 receive the input signal VIN at respective gates. A node at which the transistors TP2 and TN2 are coupled is the node N1.

The transistor TP3 is coupled between the node VDDIO and a node N2 at which the transistors TP1 and TP2 are coupled. The transistor TP3 receives the output signal VOUT at its gate and serves as a shunt circuit between the node VDDIO and the node N2, and forms a current path between the node VDDIO and the node N2 while it remains on.

The transistor TN3 is coupled between a node N3 at which the transistors TN2 and TN1 are coupled, and the node VSS. The transistor TN3 receives the output signal VOUT at its gate and serves as a shunt circuit between the node N3 and the node VSS, and forms a current path between the node N3 and the node VSS while it remains on.

The transistors TP4 and TN4 make an inverter circuit IV1. Specifically, the transistors TP4 and TN4 are coupled in series in this order between the node VDDIO and the node VSS, and are coupled to the node N1 at their gates. A node at which the transistors TP4 and TN4 are coupled outputs the output signal VOUT.

The shunt circuit 12 and the switch circuit 13 include p-type MOSFETs TP11 and TP12, respectively. The transistor TP11 is coupled at its first end to the node VDDIO, and coupled at its second gate to a first end of the transistor TP12. A second end of the transistor TP12 is the node N2, and is coupled to the node N1 via the transistor TP2. The transistor TP11 receives the output signal VOUT at its gate. The transistor TP12 receives the output signal of the inverter circuit IV2 at its gate.

The shunt circuit 14 and the switch circuit 15 include n-type MOSFETs TN11 and TN12, respectively. The transistor TN11 is coupled at its first end to the node VSS, and coupled at its second end to a first end of the transistor TN12. The second end of the transistor TN12 is the node N3, and is coupled to the node N1 via the transistor TN2. The transistor TN11 receives the output signal VOUT at its gate. The transistor TN12 receives the selection signal VSEL at its gate.

The transistors TP21 and TN21 make an inverter circuit IV2. Specifically, the transistors TP21 and TN21 are coupled in series in this order between the node VDDIO and the node VSS, and receive the selection signal VSEL at their gates. A node at which the transistors TP21 and TN21 are coupled outputs the output signal of the inverter circuit IV2.

The Schmitt trigger circuit 1 is in the high-voltage mode while the selection signal VSEL has the low level. In the high-voltage mode, the transistor TP12 remains off, and therefore the shunt circuit 12 (transistor TP11) cannot serve as a current path between the node VDDIO and the node N2 regardless of the logical level of the output signal VOUT. Similarly, in the high-voltage mode, the transistor TN12 remains off, and therefore the shunt circuit 14 (transistor TN11) cannot serve as a current path between the node N3 and the node VSS regardless of the logical level of the output signal VOUT. In the high-voltage mode, one of the transistors TP3 and TN3 turns on exclusively based on the logical level of the output signal VOUT, which causes the Schmitt trigger circuit 1 to exhibit a characteristic indicated by the solid line in FIG. 6.

Each of the thresholds VTH− and VTH+ can be respectively set to a desired magnitude by adjustment of the characteristics of the transistors TP3 and TN3.

In contrast, the Schmitt trigger circuit 1 is in the low-voltage mode while the selection signal VSEL has the high level. In the low-voltage mode, the transistor TP12 remains on, and therefore the shunt circuit 12 (transistor TP11) can serve as a current path between the node VDDIO and the node N2 based on the logical level of the output signal VOUT. Similarly, in the low-voltage mode, the transistor TN12 remains on, and therefore the shunt circuit 14 (transistor TN11) can serve as a current path between the node N3 and the node VSS based on the logical level of the output signal VOUT. In the low-voltage mode, one of the set of the transistors TP3 and TP11 and the set of the transistors TN3 and TN11 is turned on exclusively based on the logical level of the output signal VOUT, which causes the Schmitt trigger circuit 1 to exhibit a characteristic illustrated by the dashed line of FIG. 6.

The threshold VTL− can be set to a desired magnitude by adjustment of the characteristics of the transistors TP3, TP11, and TP12, for example. The threshold VTL+ can be set to a desired magnitude by adjustment of the characteristics of the transistor TN3, TN11, and TN12, for example.

The Schmitt trigger circuit 1 of the first embodiment can operate with a characteristic of a wide hysteresis with any of two power supply potentials VDDIO that have different magnitudes. Details are as follows.

In general, the Schmitt trigger circuit is required to have two thresholds with a large difference. Specifically, it is desirable that the difference between a threshold that is a boundary beyond which the voltage of the low-level input signal VIN is determined to have transitioned to the high level and a threshold that is a boundary below which the voltage of the high-level input signal VIN is determined to have transitioned to the low level, or a threshold difference, is large. A large threshold difference leads to improved performance of the Schmitt trigger circuit. On the other hand, a threshold needs to fall within a particular range due to some factors, such as a standard. With these requirements imposed, the Schmitt trigger circuit is required to operate with multiple power supply potentials recently. In this case, both requirements of a large threshold difference and thresholds within a range are desired to be satisfied in any case of operations with multiple power supply potentials. However, a Schmitt trigger circuit optimized with a particular power supply potential for satisfaction of requirements may be unable to satisfy requirements with another power supply potential, and therefore the requirements may be unable to be satisfied for all power supply potentials.

Figure 8:
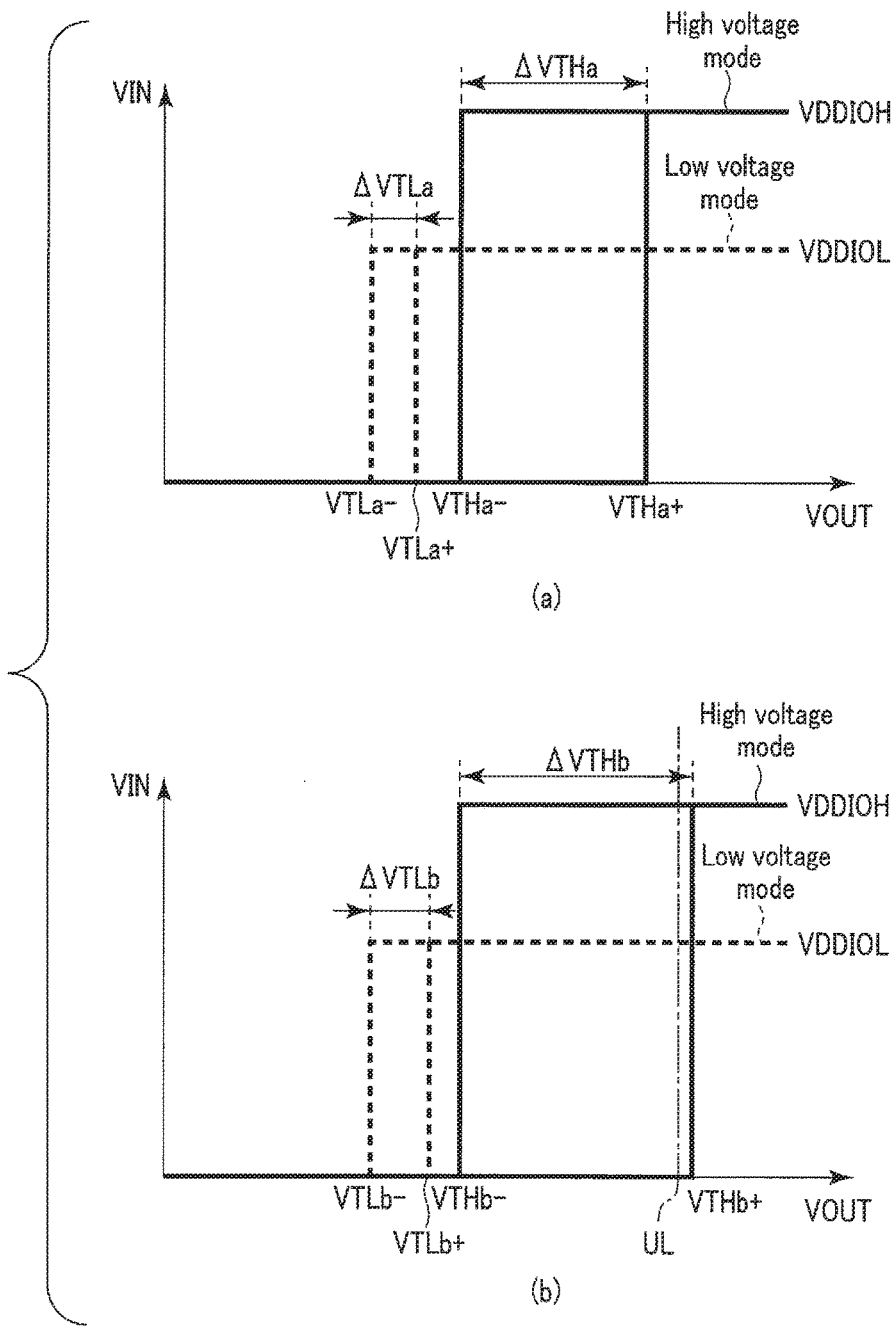
FIG. 8 illustrates a Schmitt trigger circuit of a second embodiment and an example of the layout of a semiconductor device including the same.

Such a problem is illustrated in FIG. 8, which illustrates the relationship between an input voltage and an output voltage of a Schmitt trigger circuit for reference. More specifically, FIG. 8 illustrates in section (a) characteristics in an operation with a higher power supply potential (high-voltage mode) and characteristics in an operation with a lower power supply potential for a case of the optimization made for the high-voltage mode. In contrast, FIG. 8 illustrates in section (b) characteristic in a high-voltage mode and characteristic in a low-voltage mode for a case of the optimization made for the low-voltage mode.

As illustrated in section of (a) in FIG. 8, setting up (or, optimization) based on the high-voltage mode] makes a large difference ΔVTHa between two thresholds VTHa− and VTHa+ in the high-voltage mode. However, a difference ΔVTLa between two thresholds VTLa− and VTLa+ in the low-voltage mode is narrow, and does not satisfy a requirement of a particular standard, such as ΔVTLa≥0.1×VDDIO. In contrast, as illustrated in FIG. 7, setting up based on the low-voltage mode makes a large difference ΔVTLb between two thresholds VTLb− and VTLb+ in the low-voltage mode, and satisfies a requirement, such as ΔVTLb≥0.1×VDDIO. However, setting up the Schmitt trigger circuit to achieve a large threshold difference ΔVTLb in the low-voltage mode leads to a large difference ΔVTHb between two thresholds VTHb− and VTHb+ in the high-voltage mode, which disables the threshold VTHb+ to satisfy a particular requirement for a particular standard, such as VTHb+<UL, or VTHb+≤0.75×VDDIO. Thus, the requirements of both of a large threshold difference and a threshold equal to or lower than an upper limit cannot be satisfied for both of the two different power supply potentials.

The Schmitt trigger circuit 1 of the first embodiment receives the selection signal VSEL associated with the magnitude of the power supply potential VDDIO to the semiconductor device 100, and has the shunt circuits 12 and 14 enabled or disabled based on the selection signal VSEL. This allows the Schmitt trigger circuit 1 to have one of different characteristics selected based on the logical level of the selection signal VSEL. For this reason, the characteristics of Schmitt trigger circuit 1 can be set independently for a case of an operation with a power supply potential VDDIO of a particular magnitude among different multiple magnitudes (for example, low-voltage mode), and a case of an operation with a power supply potential VDDIO of another magnitude (high-voltage mode). This enables a setup (optimization) in each of operations of two power supply potentials with different magnitudes. For this reason, in each of operations of two power supply potentials with different magnitudes, both requirements of a large threshold difference and a threshold below an upper limit can be satisfied.

Second Embodiment

In the second embodiment, the Schmitt trigger circuit 1 is supplied with an input enable signal.

Figure 9:
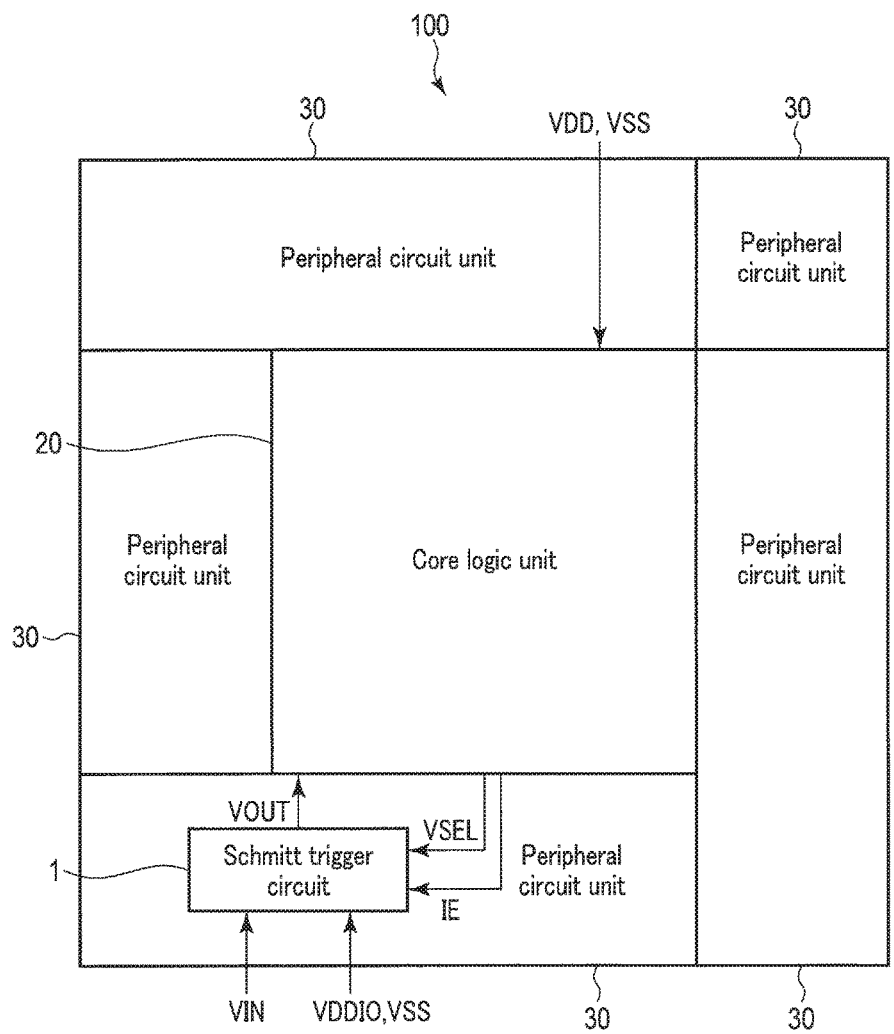
FIG. 9 illustrates a Schmitt trigger circuit of a second embodiment and an example of the layout of a semiconductor device including the same.

FIG. 9 schematically illustrates a Schmitt trigger circuit 1 of the second embodiment and an example of the layout of a semiconductor device 100 including the Schmitt trigger circuit 1, and corresponds to FIG. 1 of the first embodiment. As illustrated in FIG. 9, the core logic unit 20 supplies an input enable signal IE to the Schmitt trigger circuit 1. The input enable signal IE is a one-bit signal, for example. The Schmitt trigger circuit 1 is enabled while receiving an asserted input enable signal IE, and is disabled while receiving a negated input enable signal IE. While enabled, the Schmitt trigger circuit 1 operates as described with reference to FIGS. 2 to 6.

FIG. 10 illustrates a specific example of the Schmitt trigger circuit 1 of the second embodiment. As illustrated in FIG. 10, the Schmitt trigger circuit 1 further includes an n-type MOSFET TN31, TN32, and TN33, and a p-type MOSFET TP31. The transistors TN31, TN32, TN33, and TP31 control enabling and disabling of the Schmitt trigger circuit 1 based on the input enable signal IE.

The transistor TN31 is coupled between the transistor TN1 and the node VSS. The transistor TN32 is coupled between the transistor TN3 and the node VSS. The transistor TN33 is coupled between the transistor TN11 and the node VSS. The transistors TN31, TN32, and TN33 receive the input enable signal IE at their gates.

The transistor TP31 is coupled between the node VDDIO and the node N1, and receives input enable signal IE at its gate.

While the input enable signal IE is high, the transistors TN31, TN32, and TN33 remain on, and therefore, the Schmitt trigger circuit 1 is enabled and can operate as described with reference to FIGS. 2 to 6. In contrast, while input enable signal IE is low, the transistors TN31, TN32, and TN33 remain off and the transistor TP31 remains on. This causes the Schmitt trigger circuit 1 to keep outputting the output signal VOUT of the low level regardless of the logical level of the input signal VIN.

The Schmitt trigger circuit 1 of the second embodiment receives the selection signal VSEL associated with the magnitude of the power supply potential VDDIO for the semiconductor device 100, and includes the shunt circuits 12 and 14 disabled or enabled based on the selection signal VSEL, as in the first embodiment. This can produce the same advantages as the first embodiment.

Third Embodiment

In the third embodiment, the input enable signal is supplied to the Schmitt trigger circuit 1 as in the second embodiment. In the second embodiment, the circuit for controlling enabling and disabling of the Schmitt trigger circuit 1 based on the input enable signal IE is provided at the node VSS side in the Schmitt trigger circuit 1. In contrast, in the third embodiment, a circuit for controlling enabling and disabling of the Schmitt trigger circuit 1 based on the input enable signal IE is provided at the node VDDIO side in the Schmitt trigger circuit 1.

In the third embodiment, the semiconductor device 100 has the same layout as the second embodiment (FIG. 9), and the Schmitt trigger circuit 1 receives the input enable signal IE. The Schmitt trigger circuit 1 operates as described with reference to FIGS. 2 to 6 while enabled.

FIG. 11 illustrates a specific example of the Schmitt trigger circuit 1 of the third embodiment. As illustrated in FIG. 11, the Schmitt trigger circuit 1 further includes p-type MOSFETs TP41, TP42, and TP43, and an n-type MOSFET TN41. The transistors TP41, TP42, TP43, and TN41 control enabling and disabling of the Schmitt trigger circuit 1 based on the input enable signal IE.

The transistor TP41 is coupled between the node VDDIO and the transistor TP1. The transistor TP42 is coupled between the node VDDIO and the transistor TP3. The transistor TP43 is coupled between the node VDDIO and the transistor TP11. The transistors TP41, TP42, and TP43 receive the input enable signal IE at their gates.

The transistor TN41 is coupled between the node N1 and the node VSS, and receives the input enable signal IE at the gate.

While the input enable signal IE is low, the transistors TP41, TP42, and TP43 remain on, and therefore the Schmitt trigger circuit 1 is enabled and can operate as described with reference to FIGS. 2 to 6. In contrast, while the input enable signal IE is high, the transistors TP41, TP42, and TP43 remain off and the transistor TN41 remains on. This causes the Schmitt trigger circuit 1 to keep outputting the output signal VOUT of the high level regardless of the logical level of the input signal VIN.

The Schmitt trigger circuit 1 of the third embodiment receives the selection signal VSEL associated with the magnitude of the power supply potential VDDIO for the semiconductor device 100, and includes the shunt circuits 12 and 14 disabled or enabled based on the selection signal VSEL, as in the first embodiment. This can produce the same advantages as the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A Schmitt trigger circuit comprising:
a first circuit including a first node, and configured to output an output signal based on a potential of the first node, the first circuit being configured to output the output signal of a second logical level when the first circuit receives an input signal higher than or equal to a first threshold while outputting the output signal of a first logical level, and output the output signal of the first logical level when the first circuit receives the input signal lower than a second threshold while outputting the output signal of the second logical level, the second threshold being lower than the first threshold;

a second circuit including a first end and a second end, coupled to a first potential node at the first end, and configured to send a current between the first end and the second end based on a logical level of the output signal;
a first switch that electrically couples or uncouples the second end of the second circuit and the first node based on a selection signal;
a third circuit including a third end and fourth end, coupled to a second potential node at the third end, and configured to send a current exclusively with the second circuit between the third end and the fourth end based on the logical level of the output signal, the second potential node having a potential lower than a potential of the first potential node; and
a second switch that electrically couples or uncouples the fourth end of the third circuit and the first node based on the selection signal, wherein:
the second circuit includes a first transistor of a first conductivity type,
the first transistor and the first switch are coupled in series between the first potential node and the first node,
the third circuit includes a second transistor of a second conductivity type,
the second switch and the second transistor are coupled in series between the first node and the second potential node,
the first transistor includes a gate that receives the output signal,
the second transistor includes a gate that receives the output signal,
the first switch includes a third transistor of the first conductivity type,
the third transistor includes a gate that receives a signal of a logical level opposite to a logical level of the selection signal,
the second switch includes a fourth transistor of the second conductivity type,
the fourth transistor includes a gate that receives the selection signal,
the first node is coupled to an input of a first inverter circuit,
an output of the first inverter circuit outputs the output signal,
the first circuit further includes a second inverter circuit that receives the input signal,
an output of the second inverter circuit is coupled to the first node,
the second inverter circuit includes a fifth transistor of the first conductivity type, a sixth transistor of the first conductivity type, a seventh transistor of the second conductivity type, and an eighth transistor of the second conductivity type,
the fifth, sixth, seventh, and eighth transistors are coupled in series, and respectively include gates that receive the input signal,
the sixth transistor and the seventh transistor are coupled to each other at the first node,
the first transistor and the third transistor are coupled in series between the first potential node and a node at which the fifth transistor and the sixth transistor are coupled, and
the second transistor and the fourth transistor are coupled in series between a node at which the seventh transistor and the eighth transistor are coupled and the second potential node.

2. The Schmitt trigger circuit according to claim 1, wherein:
the first circuit includes:
a fourth circuit that includes a fifth end and a sixth end, is coupled to the first potential node at the fifth end, is coupled at the sixth end to a second node coupled to the first node via a transistor, and is configured to send a current between the fifth end and the sixth end based on the logical level of the output signal; and
a fifth circuit that includes a seventh end and an eighth end, is coupled to the second potential node at the seventh end, is coupled at the eighth end to a third node coupled to the first node via a transistor, and is configured to send a current exclusively with the fourth circuit between the seventh end and the eighth end based on the logical level of the output signal.

3. The Schmitt trigger circuit according to claim 2, wherein:
the fourth circuit includes a ninth transistor of the first conductivity type,
the ninth transistor includes a gate that receives the output signal,
the fifth circuit includes a tenth transistor of the second conductivity type, and
the tenth transistor includes a gate that receives the output signal.

4. The Schmitt trigger circuit according to claim 3, further comprising:
a sixth circuit that receives a control signal and is configured to control enabling and disabling of the Schmitt trigger circuit.

5. The Schmitt trigger circuit according to claim 4, wherein:
the sixth circuit includes:
an eleventh transistor of the second conductivity type between the eighth transistor and the second potential node, the eleventh transistor including a gate that receives the control signal,
a twelfth transistor of the second conductivity type between the tenth transistor and the second potential node, the twelfth transistor including a gate that receives the control signal,
a thirteenth transistor of the second conductivity type between the second transistor and the second potential node, the thirteenth transistor including a gate that receives the control signal, and
a fourteenth transistor of the first conductivity type between the first potential node and the first node, the fourteenth transistor including a gate that receives the control signal.

6. The Schmitt trigger circuit according to claim 4, wherein:
the sixth circuit includes:
an eleventh transistor of the first conductivity type between the first potential node and the fifth transistor, the eleventh transistor including a gate that receives the control signal,
a twelfth transistor of the first conductivity type between the first potential node and the ninth transistor, the twelfth transistor including a gate that receives the control signal,
a thirteenth transistor of the first conductivity type between the first potential node and the first transistor, the thirteenth transistor including a gate that receives the control signal, and
a fourteenth transistor of the second conductivity type between the first node and the second potential node, the fourteenth transistor including a gate that receives the control signal.

7. A Schmitt trigger circuit comprising:
a first circuit including a first node, and configured to output an output signal based on a potential of the first node, the first circuit being configured to output the output signal of a second logical level when the first circuit receives an input signal higher than or equal to a first threshold while outputting the output signal of a first logical level, and output the output signal of the first logical level when the first circuit receives the input signal lower than a second threshold while outputting the output signal of the second logical level, the second threshold being lower than the first threshold;
a second circuit including a first end and a second end, coupled to a first potential node at the first end, and configured to send a current between the first end and the second end based on a logical level of the output signal;
a first switch that electrically couples or uncouples the second end of the second circuit and the first node based on a selection signal;
a third circuit including a third end and fourth end, coupled to a second potential node at the third end, and configured to send a current exclusively with the second circuit between the third end and the fourth end based on the logical level of the output signal, the second potential node having a potential lower than a potential of the first potential node;
a second switch that electrically couples or uncouples the fourth end of the third circuit and the first node based on the selection signal; and
a fourth circuit that receives a control signal and is configured to control enabling and disabling of the Schmitt trigger circuit,
wherein the fourth circuit comprises:
a first transistor of a first conductivity type between the third circuit and the second potential node, the first transistor including a gate that receives the control signal, and
a second transistor of a second conductivity type between the first potential node and the first node, the second transistor including a gate that receives the control signal.

8. A Schmitt trigger circuit comprising:
a first circuit including a first node, and configured to output an output signal based on a potential of the first node, the first circuit being configured to output the output signal of a second logical level when the first circuit receives an input signal higher than or equal to a first threshold while outputting the output signal of a first logical level, and output the output signal of the first logical level when the first circuit receives the input signal lower than a second threshold while outputting the output signal of the second logical level, the second threshold being lower than the first threshold;
a second circuit including a first end and a second end, coupled to a first potential node at the first end, and configured to send a current between the first end and the second end based on a logical level of the output signal;
a first switch that electrically couples or uncouples the second end of the second circuit and the first node based on a selection signal;
a third circuit including a third end and fourth end, coupled to a second potential node at the third end, and configured to send a current exclusively with the second circuit between the third end and the fourth end based on the logical level of the output signal, the second potential node having a potential lower than a potential of the first potential node;
a second switch that electrically couples or uncouples the fourth end of the third circuit and the first node based on the selection signal; and
a fourth circuit that receives a control signal and is configured to control enabling and disabling of the Schmitt trigger circuit,
wherein the fourth circuit comprises:
a first transistor of a first conductivity type between the first potential node and the second circuit, the first transistor including a gate that receives the control signal, and
a second transistor of a second conductivity type between the first node and the second potential node, the second transistor including a gate that receives the control signal.

* * * * *